United States Patent
Story et al.

[11] Patent Number: 5,936,976
[45] Date of Patent: Aug. 10, 1999

[54] SELECTING A TEST DATA INPUT BUS TO SUPPLY TEST DATA TO LOGICAL BLOCKS WITHIN AN INTEGRATED CIRCUIT

[75] Inventors: Franklyn H. Story, Chandler; Koichi Eugene Nomura, Phoenix; Michael James Fickes, Tempe, all of Ariz.

[73] Assignee: VLSI Technology, Inc., San Jose, Calif.

[21] Appl. No.: 08/910,590

[22] Filed: Jul. 25, 1997

[51] Int. Cl.⁶ ............................ G01R 31/28; G06F 11/00
[52] U.S. Cl. ................................... 371/22.1; 395/183.19; 371/22.5
[58] Field of Search .................... 371/25.1, 22.1, 371/22.5, 22.6; 395/183.06, 183.18, 183.19; 324/73.1

[56] References Cited

U.S. PATENT DOCUMENTS

| | | |
|---|---|---|
| 4,225,958 | 9/1980 | Funatsu . |
| 4,357,703 | 11/1982 | Van Brunt . |
| 4,701,920 | 10/1987 | Resnick et al. . |
| 4,710,933 | 12/1987 | Powell et al. ........................... 371/25.1 |
| 4,724,380 | 2/1988 | Burrows et al. . |
| 4,764,926 | 8/1988 | Knight et al. . |
| 5,103,167 | 4/1992 | Okano et al. . |
| 5,138,619 | 8/1992 | Fasang et al. . |
| 5,153,509 | 10/1992 | Dalrymple et al. ..................... 324/73.1 |
| 5,161,160 | 11/1992 | Yaguchi et al. . |
| 5,228,139 | 7/1993 | Miwa et al. ........................ 395/183.18 |
| 5,258,986 | 11/1993 | Zerbe . |
| 5,301,156 | 4/1994 | Talley . |
| 5,361,264 | 11/1994 | Lewis . |
| 5,398,250 | 3/1995 | Nozuyama . |
| 5,418,790 | 5/1995 | Kim ........................................ 371/21.1 |
| 5,436,856 | 7/1995 | Sauvage . |
| 5,485,467 | 1/1996 | Golnabi . |
| 5,568,493 | 10/1996 | Morris . |
| 5,570,374 | 10/1996 | Yau et al. . |
| 5,581,698 | 12/1996 | Miwa et al. ........................ 395/183.18 |
| 5,623,500 | 4/1997 | Whetsel, Jr. . |

FOREIGN PATENT DOCUMENTS

| | | |
|---|---|---|
| 62-132182 | 6/1987 | Japan . |
| 4-328475 | 11/1992 | Japan . |

*Primary Examiner*—Hoa T. Nguyen
*Attorney, Agent, or Firm*—Douglas L. Weller

[57] ABSTRACT

A testing apparatus and method are for testing a plurality of logic blocks within an integrated circuit. The integrated circuit includes a test data input bus, a test data output bus coupled to the output of each logic block, and test enable means which includes selection means coupled between the plurality of logic blocks and the test data input bus. The test enable means selects a first logic block from the plurality of logic blocks, and the selection means selectively inputs to each logic block either normal operating input or the test data. The test results are received from the first logic block through the test data output bus.

18 Claims, 1 Drawing Sheet

SELECTING A TEST DATA INPUT BUS TO SUPPLY TEST DATA TO LOGICAL BLOCKS WITHIN AN INTEGRATED CIRCUIT

BACKGROUND

The present invention concerns the testing of integrated circuits and pertains particularly to the versatile testing of function systems blocks within a complex device.

Function system blocks implement a sub-function within the larger function of a complex device. The functionality of a function system block is difficult to test when contained within a larger body of logic.

Typically, the function system blocks are tested using a special test mode that externalizes the internal function system block to be tested by a method that maps the internal input/output connection of the function system block to the input/output pins of the larger device. This is accomplished, for example, by multiplexing each internal block connection to an external pin. Alternatively, the internal input/output connection of the function system block may be mapped to the input/output pins of the larger device by using serial boundary scan techniques that allow access to the internal connections through a few external pins. However, these methods often increase the die area of the device, degrade signal timing, increase internal interconnection complexity and/or increase the test program time.

SUMMARY OF THE INVENTION

In accordance with the preferred embodiment of the present invention logic blocks within an integrated circuit are tested. A test data input bus is connected to input of each of the logic blocks. Likewise, a test data output bus is connected to an output of each of the logic blocks. During testing, a first logic block is selected to receive test data held in a test data input register and to generate test results for placement onto the test data output bus. The test data is transferred to the first logic block through the test data input bus.

In the preferred embodiment, the selection of the first logic block to receive test data is done using a multiplexer which selects for input to the logic block either normal operating input or test data held in the test data input register and placed on the test data input bus. Also, the selection of the first logic block to generate test results for placement onto the test data output bus is done using a tri-state gate. In the preferred embodiment, a control bit from a test mode register is to control both the multiplexer and the tri-state gate.

For example, the test results are received from the test data output bus by a test data output register. Data may be accessed from the test data output register, the test data input register and the test mode register via any standard access means available on the integrated circuit. In the preferred embodiment, this is done using an internal data bus.

The present invention allows access to test logic blocks without any additional burden on external pins. Further, the use of a test data input bus and a test data output bus allow a large number of logic blocks to be tested using only a very few registers. This reduces circuitry required for testing and in addition simplifies the testing by allowing centralization and sharing of test circuitry within the integrated circuit.

DESCRIPTION OF THE PREFERRED EMBODIMENT

Figure 1:
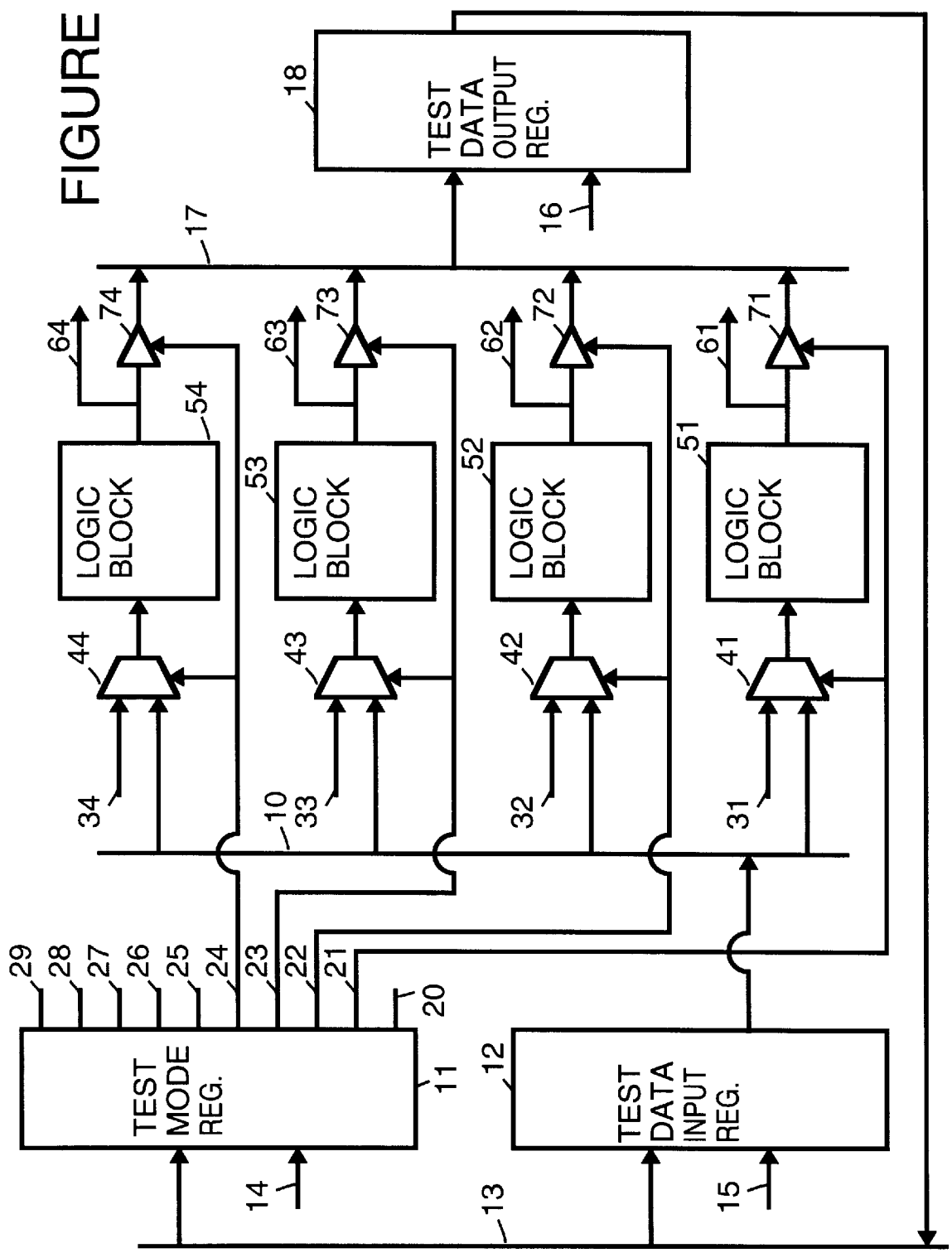
FIG. 1 is a simplified block diagram of a test system which uses a single set of internal test registers to test multiple function system blocks in accordance with the preferred embodiment of the present invention.

FIG. 1 shows a logic block 51, a logic block 52, a logic block 53 and a logic block 54 which are all part of a complex device residing within a single integrated circuit. Each of logic block 51, logic block 52, logic block 53 and logic block 54 are a function system block. There are typically more function system blocks within a complex device, however, the four logic blocks shown in FIG. 1 are sufficient to illustrate the features of the present invention.

Under normal operation, logic block 51 receives input on lines 31. Likewise under normal operation, logic block 52 receives input on lines 32, logic block 53 receives input on lines 33 and logic block 54 receives input on lines 34. Logic block 51 places values on lines 61, which are utilized as outputs under normal operating conditions. Logic block 52 places values on lines 62, which are utilized as outputs under normal operating conditions. Logic block 53 places values on lines 63, which are utilized as outputs under normal operating conditions. Logic block 54 places values on lines 64, which are utilized as outputs under normal operating conditions.

The complex device shown in FIG. 1 additionally includes a test mode register 11, a test data input register 12 and a test data output register 18. Test mode register 11, test data input register 12 and test data output register 18 may be accessed through any register access mechanism that already exists on the complex device. For example, FIG. 1 shows test mode register 11, test data input register 12 and test data output register 18 connected to an internal data bus 13 of the complex device.

Test data input register 12 provides an alternate set of inputs to the logic blocks of the complex device. In the embodiment shown in FIG. 1, the information stored by test data input register 12 is placed on a test data input bus 10.

Test data output register 18 can receive outputs from the logic blocks of the complex device. In the embodiment shown in FIG. 1, the information stored by test data output register 18 is received via a test data output bus 17.

Using test mode register 11, test data input register 12 and test data output register 18, access to the logic blocks of the complex device is possible without any additional burden on the external pins of the complex device.

Values in test mode register 11 control testing of the logic blocks of the complex device. For example, test mode register 11 exists in configuration space, which is not normally accessed by operating systems or application software. For each of logic blocks 51 through 54, test mode register 11 includes a test control bit. Each bit is cleared to the disable state at system reset. This allows for normal operation of the complex device. In order to test a logic block, a test control bit for the logic block is asserted for the logic block and a write cycle is performed.

For example, in preparation for a test of logic block 51, internal data bus 13 and a test mode write strobe 14 are used to load a test configuration value for logic block 51 into test mode register 11. The test configuration value for logic block 51 asserts the bit corresponding to a test mode line 21. This causes a multiplexer 41 to select test data input bus 10 as inputs to logic block 51, rather than normal inputs on lines 31. The assertion of the bit corresponding to a test mode line 21 within the test configuration placed in test mode register 11 also results in tri-state gate 71 being turned "on" connecting the outputs of logic block 51 to test data output bus 17.

A test data write strobe 15 is used to load a test value from internal data bus 13 into test data input register 12. This test value, through test data input bus 10, is received as inputs by logic block 51. Logic block 51 produces the corresponding outputs which are received, through test data output bus 17, at the inputs of test data output register 18. In response to assertion of a test data read enable strobe on line 16, the results are captured by data output register 18. These results may be then accessed using internal data bus 13.

In preparation for a test of logic block 52, internal data bus 13 and test mode write strobe 14 are used to load a test configuration value for logic block 52 into test mode register 11. The test configuration value for logic block 52 asserts the bit corresponding to a test mode test mode line 22. This causes a multiplexer 42 to select test data input bus 10 as inputs to logic block 52, rather than normal inputs on lines 32. The assertion of the bit corresponding to a test mode test mode line 22 within the test configuration placed in test mode register 11 also results in tri-state gate 72 being turned "on" connecting the outputs of logic block 52 to test data output bus 17.

Test data write strobe 15 is used to load a test value from internal data bus 13 into test data input register 12. This test value, through test data input bus 10, is received as inputs by logic block 52. Logic block 52 produces the corresponding outputs which are received, through test data output bus 17, at the inputs of test data output register 18. In response to assertion of test data read enable strobe on line 16, the results are captured by data output register 18. These results may be then accessed using internal data bus 13.

In preparation for a test of logic block 53, internal data bus 13 and test mode write strobe 14 are used to load a test configuration value for logic block 53 into test mode register 11. The test configuration value for logic block 53 asserts the bit corresponding to a test mode line 23. This causes a multiplexer 43 to select test data input bus 10 as inputs to logic block 53, rather than normal input on lines 33. The assertion of the bit corresponding to a test mode line 23 within the test configuration placed in test mode register 11 also results in tri-state gate 73 being turned "on" connecting the outputs of logic block 53 to test data output bus 17.

Test data write strobe 15 is used to load a test value from internal data bus 13 into test data input register 12. This test value, through test data input bus 10, is received as inputs by logic block 53. Logic block 53 produces the corresponding outputs which are received, through test data output bus 17, at the inputs of test data output register 18. In response to assertion of test data read enable strobe on line 16, the results are captured by data output register 18. These results may be then accessed using internal data bus 13.

In preparation for a test of logic block 54, internal data bus 13 and test mode write strobe 14 are used to load a test configuration value for logic block 54 into test mode register 11. The test configuration value for logic block 54 asserts the bit corresponding to a test mode line 24. This causes a multiplexer 44 to select test data input bus 10 as inputs to logic block 54, rather than normal inputs on lines 34. The assertion of the bit corresponding to a test mode line 24 within the test configuration placed in test mode register 11 also results in tri-state gate 74 being turned "on" connecting the output of logic block 54 to test data output bus 17.

Test data write strobe 15 is used to load a test value from internal data bus 13 into test data input register 12. This test value, through test data input bus 10, is received as inputs by logic block 54. Logic block 54 produces the corresponding outputs which are received, through test data output bus 17, at the input of test data output register 18. In response to assertion of test data read enable strobe on line 16, the results are captured by data output register 18. These results may be then accessed using internal data bus 13.

When not testing the logic blocks within complex device the special test modes appear to be non-existent. In normal operating mode, the test value in test mode register 11 is cleared so that test mode access to each of logic blocks 51 through 54 is disabled.

In the preferred embodiment of the present invention, test mode register 11, test data input register 12 and test data output register 18 are all placed in the same configuration address space of the complex device. In alternate preferred embodiments of the present invention, test data input register 12 and/or test data output register 18 may be placed in an operating range of the complex device and may even be utilized as ordinary registers.

Also, logic blocks may be tested together provided the output bits used by each logic block on test data output bus 17 do not overlap. For example, test data output bus 17 is a sixteen bit bus. Output from logic block 51 is placed on the five lowest order bits of test data output bus 17. Output from logic block 52 is placed on the 11 highest order bits of test data output bus 17. Thus logic block 51 and logic block 52 may be tested together because there is no overlap of output bits on test data output bus 17. However, in order for this to work, inputs to logic block 51 and logic block 52 can be shared as needed. This is workable, for example, when it is acceptable that any bits of test data input bus 10, shared by logic block 51 and logic block 52, have the same value for the test.

A test mode line 25, a test mode line 26, a test mode line 27, a test mode line 28 and a test mode line 29 are used, for example, to select additional logic blocks (not shown) for testing. Each test mode line additionally may control tests for more than one logic block. A test mode line 20 is used, for example, to enable a counter test mode.

Table 1 below summarizes an example configuration of test mode register 11 when test mode register 16 has sixteen bits. In Table 1 below, logic block (1) is equivalent to logic block 51, logic block (2) is equivalent to logic block 52, logic block (3) is equivalent to logic block 53, and logic block (4) is equivalent to logic block 54. Logic blocks (5–10) are additional logic blocks not shown in FIG. 1.

TABLE 1

| Bit Number | Logic Block Number | Test Mode |
| --- | --- | --- |
| 15 | Reserved | Always 0 |
| 14 | Reserved | Always 0 |
| 13 | Reserved | Always 0 |
| 12 | Reserved | Always 0 |
| 11 | Reserved | Always 0 |
| 10 | Reserved | Always 0 |
| 9 | (10) | 0 = disabled, 1 = enabled |
| 8 | (8) | 0 = disabled, 1 = enabled |
| 7 | (7) | 0 = disabled, 1 = enabled |
| 6 | (6) | 0 = disabled, 1 = enabled |
| 5 | (5) | 0 = disabled, 1 = enabled |
| 4 | (4) | 0 = disabled, 1 = enabled |
| 3 | (3) | 0 = disabled, 1 = enabled |
| 2 | (2) | 0 = disabled, 1 = enabled |
| 1 | (1) and (9) | 0 = disabled, 1 = enabled |
| 0 | Counter Test Mode | 0 = disabled, 1 = enabled |

Likewise, in an example configuration, test data input register 12 has twenty-four bits, twenty-two of which are connected to test data input bus 10. Logic block 51 utilizes the eleven lowest order bits of test data input bus 10 as test input. Logic block 52 utilizes the twenty lowest order bits of test data input bus as test input. Logic block 53 utilizes all the bits of test data input bus 10 as test input. Logic block 54 utilizes the nineteen lowest order bits of test data input bus 10 as test input.

Also, in an example configuration, test data output register 18 has sixteen bits, all of which are connected to test data output bus 17. Logic block 51 places output on the five lowest order bits of test data output bus 17 during lock 52 places output on the eleven highest order bits of test data output bus 17 during testing. Logic block 53 places output on the fourteen lowest order bits of test data output bus 17 during testing. Logic block 51 places output on all bits of test data output bus 17 during testing.

In an alternative embodiment, test data input register 12 and test data output register 18 may be implemented using a single test register. In this case, using the example configuration set out above, the test register has twenty-four bits. The lowest order sixteen bits have read write access and are used both as test input and test output. The next six bits of test data input register 12 are write-only and are used to receive test data to be forwarded to test data input bus 10.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We Claim:

1. Testing apparatus for testing a plurality of logic blocks within an integrated circuit, the testing apparatus comprising the following elements contained within the integrated circuit:

a test data input bus;

a test data output bus coupled to output of each logic block from the plurality of logic blocks for receiving test results therefrom;

test data input register means holding test data, coupled to the test data input bus, for supplying test data thereto; and, test enable means, coupled between each logic block from the plurality of logic blocks and said test data input bus, for selecting a first logic block from the plurality of logic blocks and inputting to the first logic block the test data held in the test data input register means from the test data input bus, the test enable means including;

selection means, coupled to the plurality of logic blocks for selectively inputting to each logic block either normal operating input or the test data held in the test data input register means.

2. Testing apparatus as in claim 1 additionally comprising:

a test data output register, coupled to the test data output bus, for receiving test results;

wherein the test enable means additionally selects the first logic block from the plurality of logic blocks to supply the test results received by the test data output register, the test data being transferred from the first logic block through the test data output bus.

3. Testing apparatus as in claim 2 additionally comprising selection means, coupled to the plurality of logic blocks for selectively inputting to each logic block either normal operating input or the test data held in the test data input register means, wherein the selection means includes:

a plurality of multiplexers, each multiplexer being coupled to input of a logic block from the plurality of logic blocks, each multiplexer selecting for input to the logic block either the normal operating input or the test data held in the test data input register means.

4. Testing apparatus as in claim 3 wherein the test enable means additionally comprises:

a plurality of tri-state means, each tri-state means being coupled to output of an associated logic block from the plurality of logic blocks, each tri-state selecting whether output from the associated logic block supplies the test results received by the test data output register.

5. Testing apparatus as in claim 4 wherein the testing apparatus additionally comprises:

a test mode register which contains a plurality of control bits, each control bit being coupled through a line to control both a multiplexer from the plurality of multiplexers and a tri-state means from the plurality of tri-state means.

6. Testing apparatus as in claim 5 wherein the test mode register, the test data input register means and the test data output register are each coupled to an internal data bus for the integrated circuit.

7. Testing apparatus as in claim 1 wherein the selection means includes:

a plurality of multiplexers, each multiplexer being coupled to input of a logic block from the plurality of logic blocks, each multiplexer selecting for input to the logic block either the normal operating input or the test data held in the test data input register means.

8. Testing apparatus as in claim 7 wherein the testing apparatus additionally comprises:

a test mode register which contains a plurality of control bits, each control bit being coupled through a line to control a multiplexer from the plurality of multiplexer.

9. Testing apparatus as in claim 1 additionally comprising selection means, coupled to the plurality of logic blocks for selectively inputting to each logic block either normal operating input or the test data held in the test data input register means.

10. Testing apparatus as in claim 1 wherein the test enable means is coupled between each logic block from the plurality of logic blocks and the test data input bus.

11. A method for testing a plurality of logic blocks within an integrated circuit, the integrated circuit comprises a test data input bus, a test data output bus coupled to the output of each logic block, test enable means including selection means coupled between the plurality of logic blocks and the test data input bus, the method comprising the steps of:

selecting, by the test enable means, a first logic block from the plurality of logic blocks and selectively inputting, by said selection means, to each logic block either normal operating input or test data; and receiving test results from the first logic block through the test data output bus.

12. A method as in claim 11 wherein the test data is transferred from a test data input register.

13. A method as in claim 11 wherein the test results are received from a test data output bus into a test data output register.

14. A method as in claim 11 wherein the selection means is a multiplexer.

15. A method as in claim 11 further comprising the step of:

providing a tri-state gate for connecting the test results to the test data output bus.

16. A method as in claim 14 further comprising the step of:

using a control bit from a test mode register to control the multiplexer and the tri-state gate.

17. A method as in claim 14 further comprising the step of using a control bit from a test mode register to control the multiplexer.

18. A method for testing a plurality of logic blocks within an integrated circuit, the method comprising the steps of:

(a) selecting a first logic block from the plurality of logic blocks to receive test data;

(b) selectively transferring normal operating input or the test data to the first logic block from a test data input bus to each of the logic blocks, the test data input bus being dedicated to transferring the normal operating input and the test data to the plurality of logic blocks; and, (c) receiving test results from the first logic block from a test data output bus, the test data output bus being dedicated to receiving test data from the plurality of logic blocks;

wherein:

in step (b) the test data is transferred from an internal data bus for the integrated circuit into a test data input register, and from the test data input register to the test data input bus;

in step (c) the test results are received from the test data output bus into a test data output register, and from the test data output register onto the internal data bus for the integrated circuit; and, the integrated circuit comprises said test data input bus, said test data output bus, said test data input register, and said test data output register.

\* \* \* \* \*